(12) United States Patent
Kwon

(10) Patent No.: US 10,109,791 B2
(45) Date of Patent: Oct. 23, 2018

(54) NONVOLATILE MEMORY DEVICE AND METHOD OF FABRICATING THE SAME

(71) Applicant: Euipil Kwon, San Jose, CA (US)

(72) Inventor: Euipil Kwon, San Jose, CA (US)

( * ) Notice: Subject to any disclaimer, the term of this patent is extended or adjusted under 35 U.S.C. 154(b) by 0 days.

(21) Appl. No.: 15/246,161

(22) Filed: Aug. 24, 2016

(65) Prior Publication Data

US 2018/0061888 A1   Mar. 1, 2018

(51) Int. Cl.
| | | |
|---|---|---|
| *H01L 45/00* | (2006.01) | |
| *H01L 27/24* | (2006.01) | |
| *H01L 29/872* | (2006.01) | |
| *H01L 27/06* | (2006.01) | |
| *H01L 27/22* | (2006.01) | |

(52) U.S. Cl.
CPC ........ *H01L 45/122* (2013.01); *H01L 27/0629* (2013.01); *H01L 27/224* (2013.01); *H01L 27/226* (2013.01); *H01L 27/2409* (2013.01); *H01L 27/2427* (2013.01); *H01L 27/2445* (2013.01); *H01L 29/872* (2013.01); *H01L 45/12* (2013.01); *H01L 45/1226* (2013.01); *H01L 45/1233* (2013.01); *H01L 45/1246* (2013.01)

(58) Field of Classification Search
CPC ................ H01L 45/04; H01L 45/1206; H01L 27/11563; H01L 29/408; H01L 27/2427; H01L 45/12; H01L 45/122; H01L 45/1226; H01L 45/1233; H01L 45/1246
See application file for complete search history.

(56) References Cited

U.S. PATENT DOCUMENTS

| | | | | |
|---|---|---|---|---|
| 6,087,689 A | * | 7/2000 | Reinberg | ............ H01L 27/1021 257/296 |
| 7,368,789 B1 | * | 5/2008 | Dhaoui | .............. G11C 16/0433 257/314 |
| 2003/0160280 A1 | * | 8/2003 | Yoshino | ............ H01L 21/28282 257/324 |
| 2005/0173766 A1 | * | 8/2005 | Chae | ................... H01L 29/4908 257/369 |
| 2005/0174847 A1 | * | 8/2005 | Forbes | ................. G11C 7/1045 365/185.08 |
| 2006/0180811 A1 | * | 8/2006 | Lee | ........................... C07F 7/10 257/40 |

(Continued)

FOREIGN PATENT DOCUMENTS

| | | | | |
|---|---|---|---|---|
| JP | 2008205191 A | * | 9/2008 | ............. H01L 27/10 |
| KR | 10-1997-0067848 A | | 10/1997 | |
| KR | 10-2001-0056831 A | | 7/2001 | |

*Primary Examiner* — Eduardo A Rodela
(74) *Attorney, Agent, or Firm* — Goldilocks Zone IP Law

(57) ABSTRACT

The nonvolatile memory device includes a semiconductor substrate, a first and a second diffusion regions formed under a surface of the semiconductor substrate, a storage layer formed on the semiconductor substrate, a gate stacked on the storage layer, wherein the first diffusion region may at least one of active regions being separated by a part of the semiconductor substrate forming a channel region, wherein the second diffusion region may include an active region intersecting the gate insulating layer, wherein the storage layer may include an insulating layer or a variable resistor, and may service as a data storage layer to store data, and may be selected by a structure including the first and the second diffusion regions.

21 Claims, 14 Drawing Sheets

(56) References Cited

U.S. PATENT DOCUMENTS

| | | | | |
|---|---|---|---|---|
| 2007/0236994 A1* | 10/2007 | Hsu | .................... | G11C 16/0466 |
| | | | | 365/185.18 |
| 2011/0085382 A1* | 4/2011 | Lee | .................... | G11C 16/0441 |
| | | | | 365/185.18 |
| 2011/0096609 A1* | 4/2011 | Lee | .................... | G11C 16/0425 |
| | | | | 365/185.28 |
| 2013/0026558 A1* | 1/2013 | Jeon | ..................... | H01L 29/685 |
| | | | | 257/324 |
| 2013/0249011 A1 | 9/2013 | Kwon | | |
| 2014/0219015 A1* | 8/2014 | Li | ............................ | G11C 7/00 |
| | | | | 365/182 |
| 2016/0086961 A1* | 3/2016 | Owada | .............. | H01L 27/11529 |
| | | | | 438/258 |
| 2017/0110512 A1* | 4/2017 | Chung | ................ | H01L 27/2454 |

\* cited by examiner

[FIG. 1A]
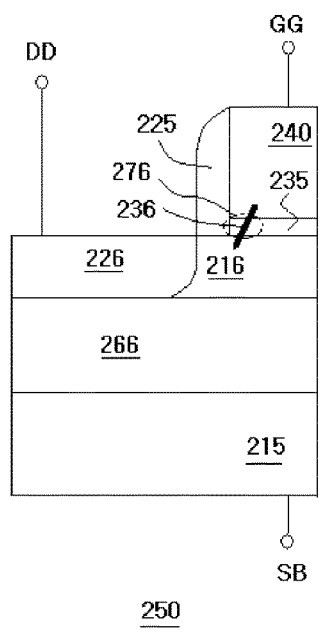
[FIG. 1B]
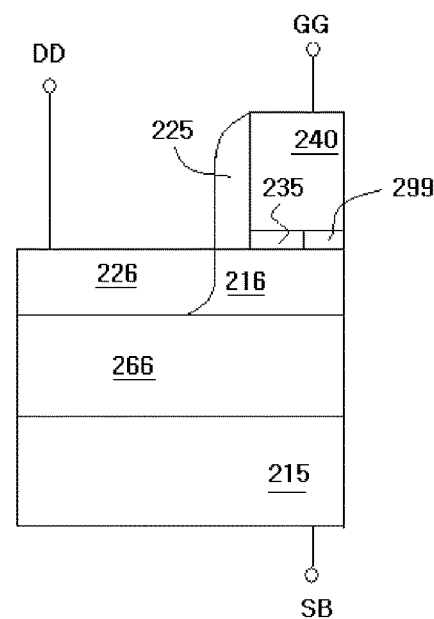

[FIG. 1C]
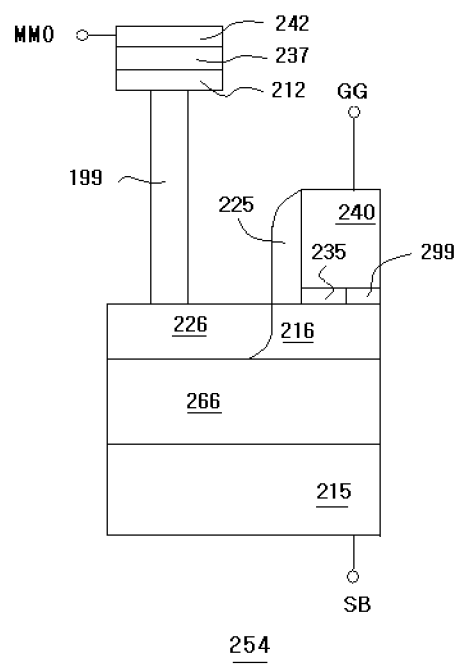
254
[FIG. 1D]
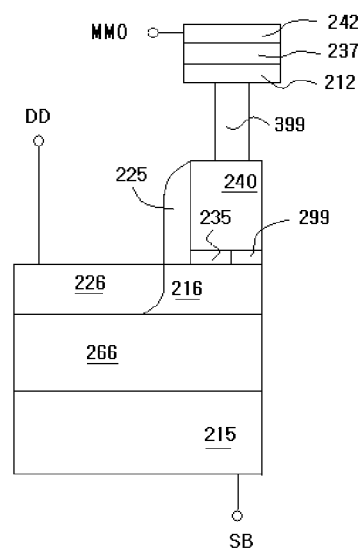
256

[FIG. 1E]
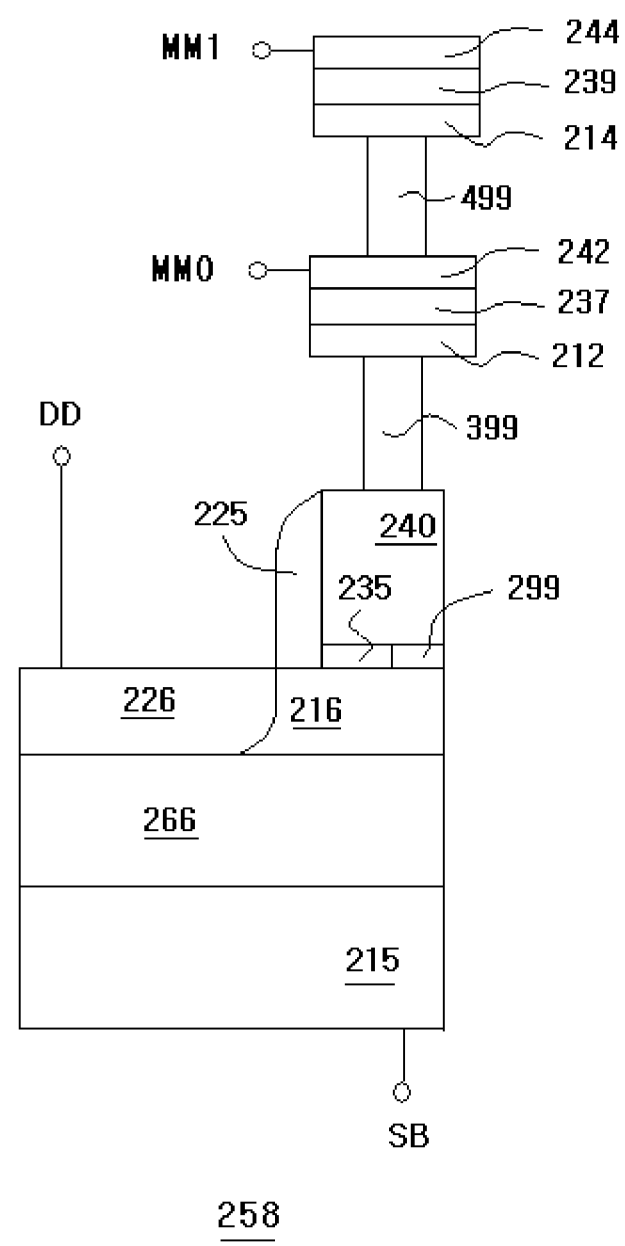

[FIG. 1F]
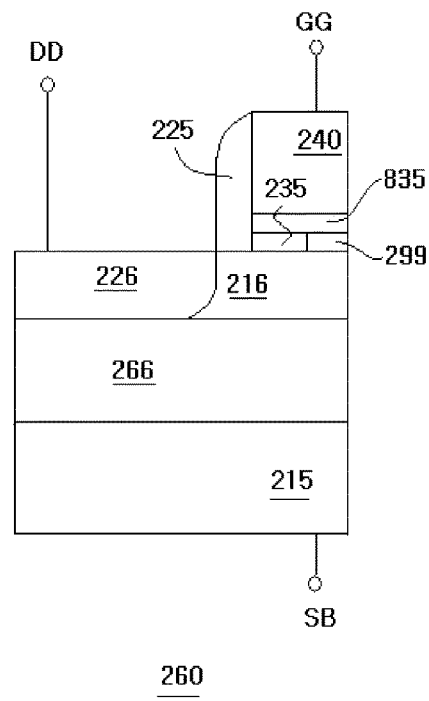
[FIG. 2A]
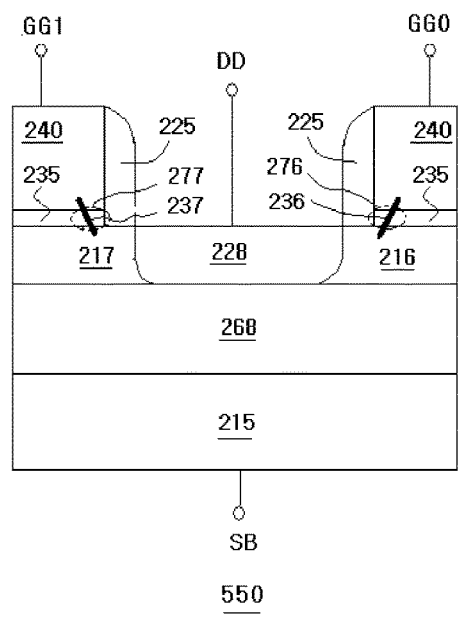

[FIG. 2B]
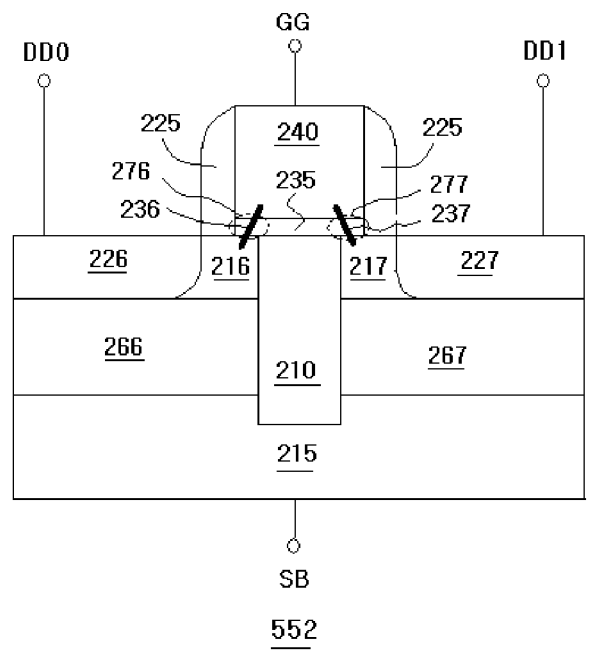
[FIG. 2C]
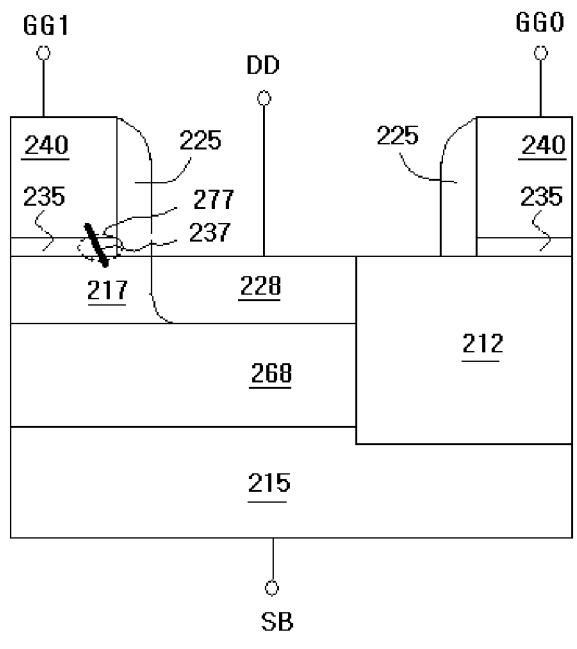

[FIG. 3]
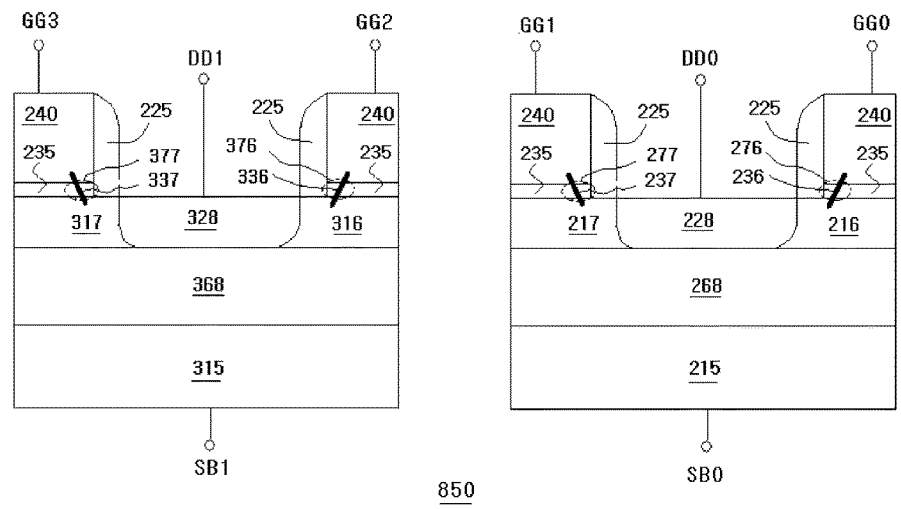
850
[FIG. 4A]
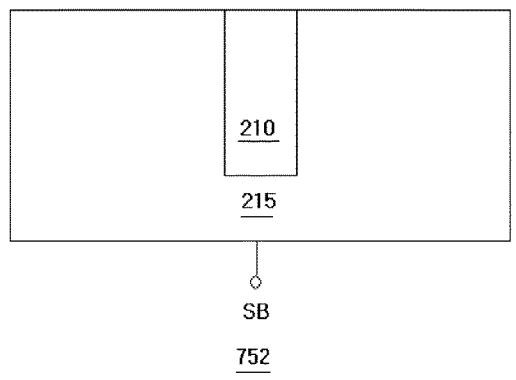

[FIG. 4B]
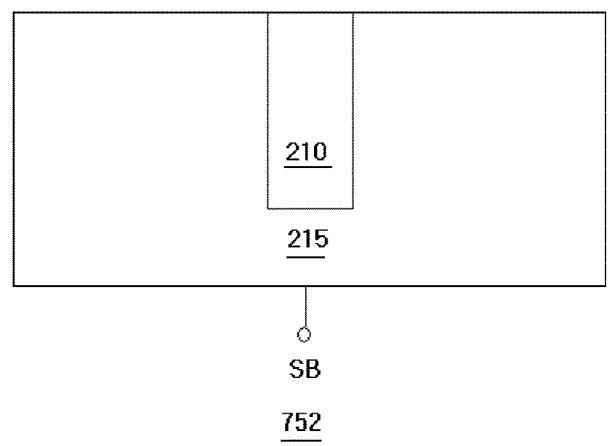
[FIG. 4C]
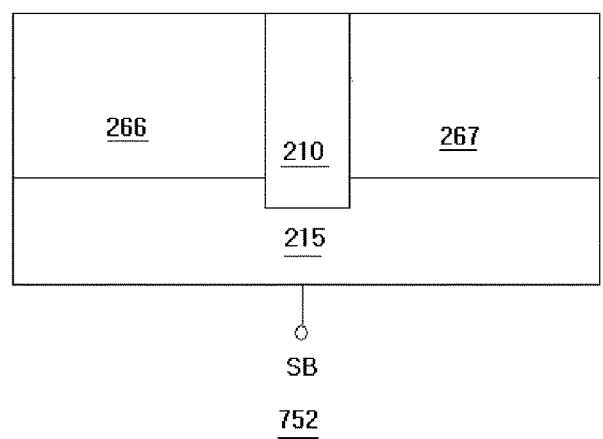

[FIG. 4D]
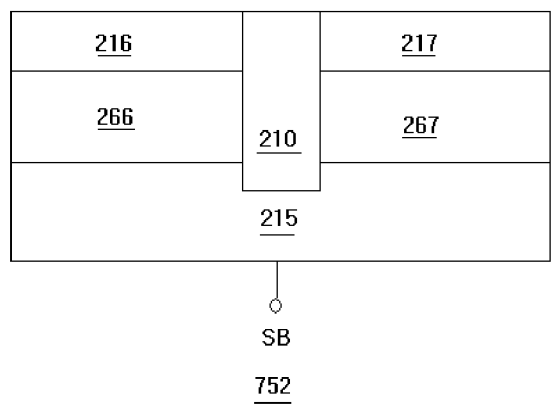
[FIG. 4E]
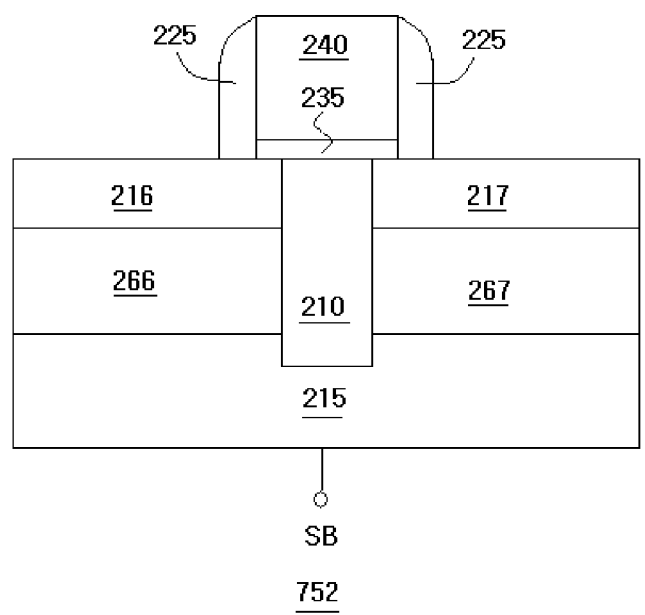

[FIG. 4F]
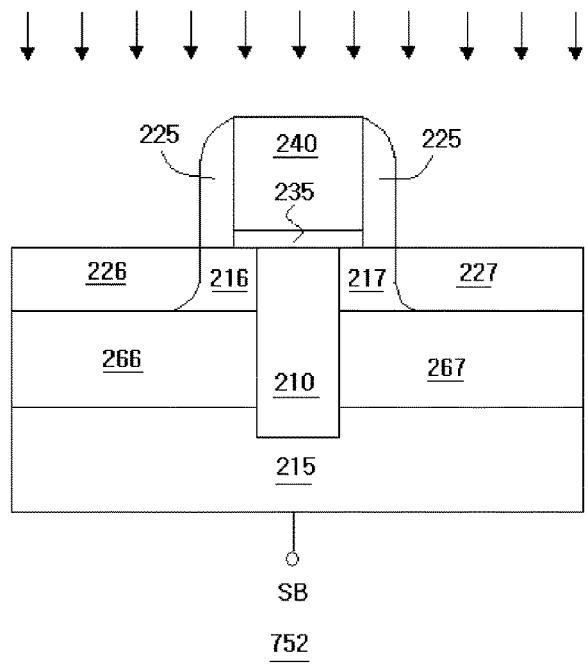
[FIG. 4G]
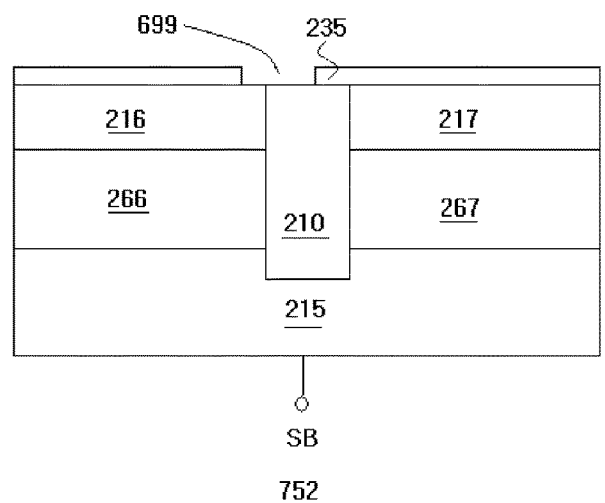

[FIG. 4h]
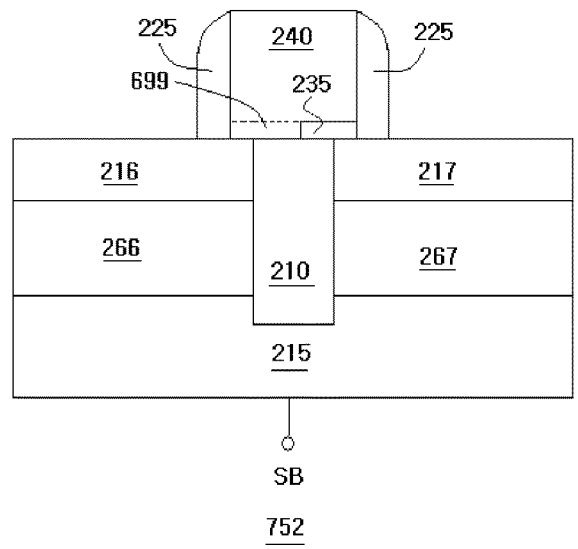
[FIG. 5]
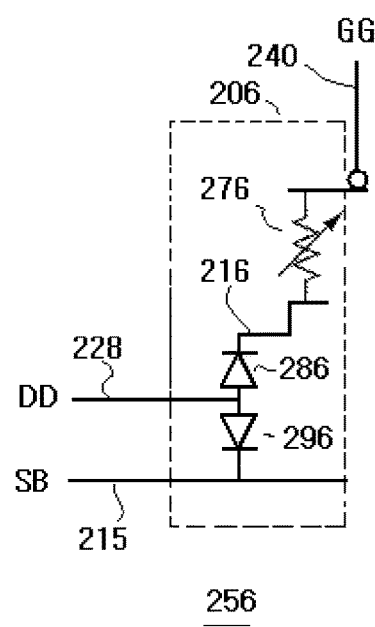

【FIG. 6A】
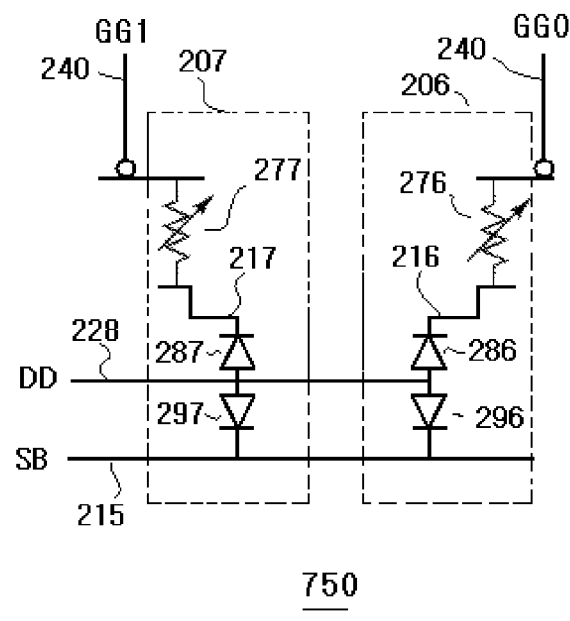
【FIG. 6B】
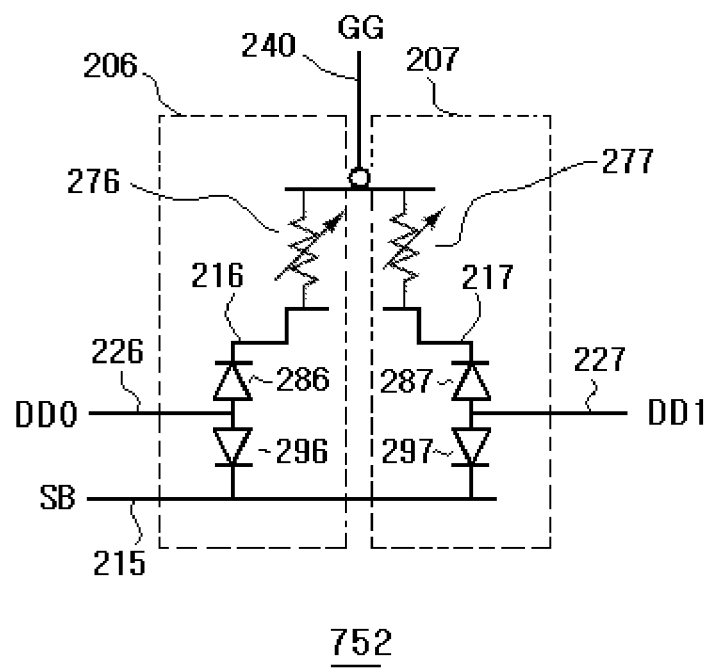

[FIG. 7]
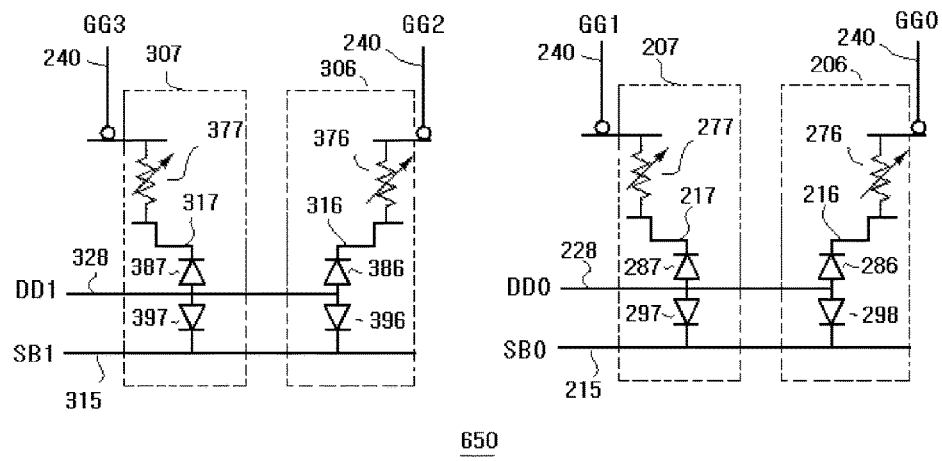
[FIG. 8A]
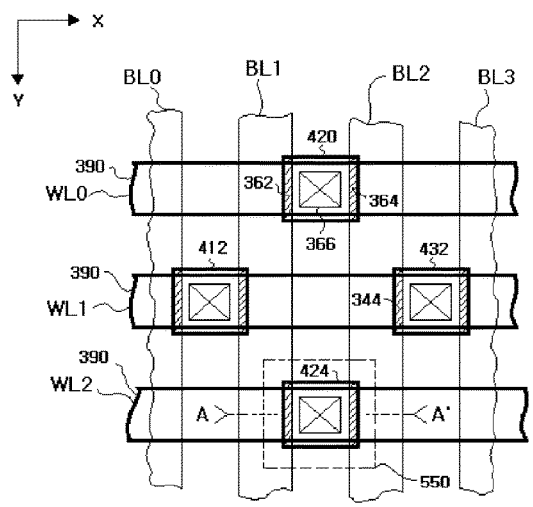

[FIG. 8B]
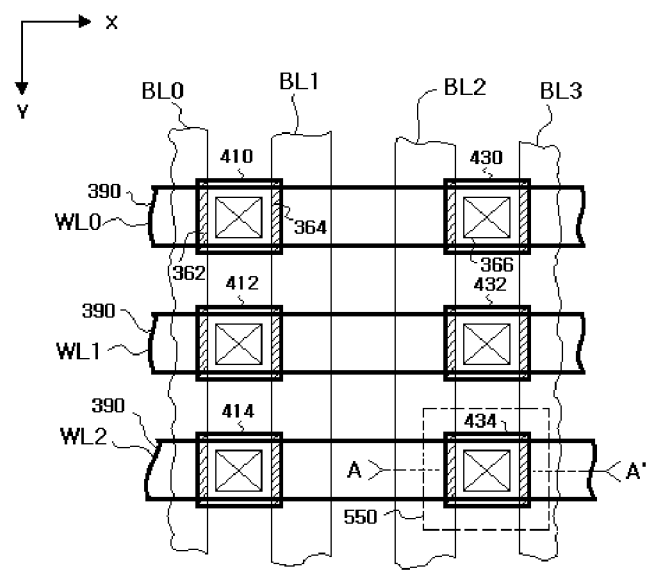
142
[FIG. 8C]
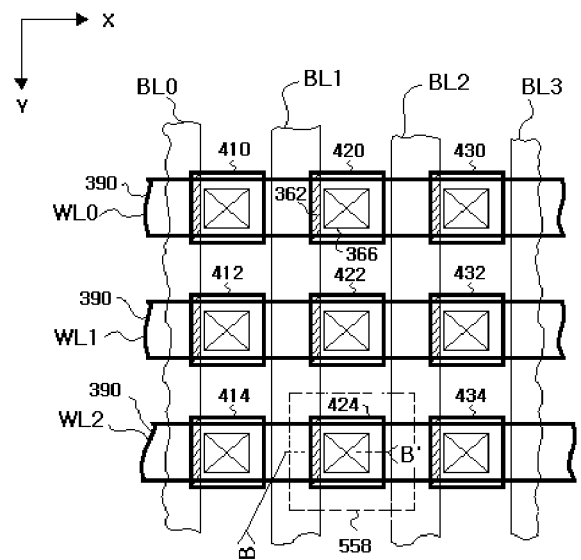
146

[FIG. 9]
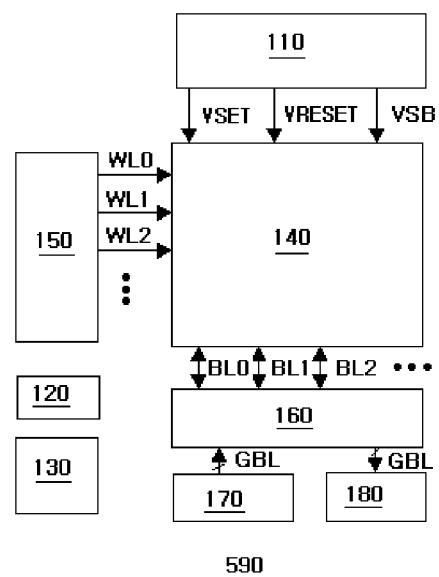

NONVOLATILE MEMORY DEVICE AND METHOD OF FABRICATING THE SAME

BACKGROUND

1. Field

Embodiments of the inventive concept relate to a nonvolatile memory device and a method of fabricating the same and, more particularly, to a nonvolatile memory device including a part of a transistor serving as a basic structure, an insulating layer or a variable resistor.

2. Description of Related Art

A conventional art disclosed in US Patent Publication No. 20130249017 related a nonvolatile memory device and a method of fabricating the same. The nonvolatile memory device includes a memory cell having a transistor in which an insulating isolation layer is formed in a channel region. The nonvolatile memory device includes a metal-oxide-semiconductor (MOS) transistor as a basic component. An insulating isolation layer is formed in at least a channel region, and a gate insulating layer includes an insulating layer or a variable resistor and serves as a data storage. A gate includes a metal layer formed in a lower portion thereof. A first source and a drain regions are lightly doped with a dopant, and a second source and a drain regions are heavily doped with a dopant. Alternatively, the nonvolatile memory device includes a MOS transistor serving as a basic component. The MOS transistor includes at least a channel region in which an insulating isolation layer is formed, and a gate insulating layer includes an insulating layer or a variable resistor and serves as a data storage. A gate includes a conductive layer, a first and a second source regions form a diode, and a first and a second drain regions form a diode.

A conventional art disclosed in Korean Patent Publication No. 2001-0056831 relates to a method of forming an anti-fuse of a semiconductor device, more specifically, a method of forming an anti-fuse of a semiconductor device, which may easily break an insulating layer at a lower voltage using a right-angled corner of a semiconductor substrate. The disclosed method includes forming a predetermined pattern on a semiconductor substrate on which a process for a lower structure is completely performed to form a structure having right-angled corners, depositing a gate oxide layer and stacking a nitride layer and a first polysilicon (poly-Si) layer on the gate oxide layer, forming a photoresist pattern to expose the first poly-Si layer formed on the right-angled corners of the semiconductor substrate, dry etching the exposed first poly-Si layer to firstly expose the nitride layer formed on the right-angled corners of the semiconductor substrate, dry etching the nitride layer, and depositing a second poly-Si layer and forming a pattern. In the above-described method of forming the anti-fuse of the semiconductor device, an anti-fuse capable of easily breaking an insulating layer at a lower voltage may be fabricated.

Another conventional art disclosed in Korean Patent Publication No. 1997-0067848 relates to a semiconductor memory device and a method of fabricating the same. The semiconductor memory device includes an access transistor T configured to access information of word lines, a storage node capacitor C configured to store information stored through a bit line due to an operation of the access transistor T, and a charge-up transistor P configured to supply charges to the storage node capacitor C. In the above-described semiconductor memory device, charges may be continuously supplied to the storage node capacitor C so that a processing speed of the semiconductor memory device can be improved.

Meanwhile, a nonvolatile semiconductor memory device may be a semiconductor memory device in which information stored in a memory cell is retained even if power supply is interrupted.

The nonvolatile memory device may be electrically programmed. The nonvolatile memory device may include memory cells in which storage layers include insulating layers or variable resistors.

When the storage layers include the insulating layers, a high voltage for a program operation may be applied to both electrodes (i.e., a first electrode and a second electrode) between the insulating layers to cause a breakdown. In this case, a resistive path may be generated so that the insulating layers may be changed from an insulation state to a conduction state. Accordingly, the insulating layers may become anti-fuses. When the insulating layers are in the conduction state, the nonvolatile memory device may be in a programmed state, and the programmed state may be defined as storage of data '0.' Also, when the insulating layers are in the insulation state, the nonvolatile memory device may be in an unprogrammed state, and the unprogrammed state may be defined as storage of data '1.'

Conversely, the conduction state may be defined as data '1,' and the insulation state may be defined as data '0.'

When the storage layers are the variable resistors, the variable resistors may include a resistance variable material or a phase transition material.

In a case in which the variable resistors of the memory cell include the resistance variable material, when a voltage equal to or higher than a set voltage is applied to both electrodes (i.e., a first electrode and a second electrode) between the variable resistors, the variable resistors may be put into a low resistance state, and when a voltage equal to or higher than a rest voltage is applied to the first and the second electrodes between the variable resistors, the variable resistors may be put into a high resistance state. Accordingly, the low resistance state may be defined as storage of data '0,' and the high resistance state may be defined as storage of data '1.' Conversely, the low resistance state may be defined as storage of data '1,' and the high resistance state may be defined as storage of data '0.'

The resistance variable material is being developed using various materials, such as perovskite, transition metal oxides, and chalcogenides.

Memory devices using the resistance variable material may be classified into several types according to materials. A first type is a memory device in which a colossal magnetoresistance (CMR) material, such as $Pr_{1-x}Ca_xMnO_3$ (PCMO), is inserted between electrodes and a variation in resistance due to an electric field is used. A second type is a memory device in which a binary oxide, such as niobium oxide ($Nb_2O_5$), titanium oxide ($TiO_2$), nickel oxide (NiO), or aluminum oxide ($Al_2O_3$), is prepared to have a nonstoichiometric composition and used as a resistance variable material. A third type is a memory device in which a chalcogenide material maintains an amorphous structure and a difference in resistance due to a variation in the threshold voltage of an ovonic switch is used, instead of supplying a large current to the chalcogenide material to change the phase of the chalcogenide material as in a phase-change random access memory (PRAM). A fourth type is a memory device in which a ferroelectric material, such as strontium titanium oxide ($SrTiO_3$) or strontium zirconium oxide ($SrZrO_3$), is doped with chromium (Cr) or Nb to change a resistance state. A final type is a memory device including programmable metallization cells (PMCs) in which silver (Ag) having a high ion mobility is doped into a solid electrolyte, such as germanium selenium (GeSe), so that two resistance states are formed depending on whether or not a conductive channel is formed in a medium due to an electrochemical reaction. In addition, materials or fabrication processes capable of embodying two stable resistance states to obtain memory characteristics have been reported.

In a case in which the variable resistors of the memory cell include the phase transition material, when the phase transition material is in a low resistance state, the low resistance state may be defined as storage of data '0,' and when the phase transition material is in a high resistance state, the high resistance state may be defined as storage of data '1.' Conversely, the low resistance state may be defined as storage of data '1,' and the high resistance state may be defined as storage of data '0.'

The phase transition material may be changed into a crystalline phase or an amorphous phase due to a predetermined current. The crystalline phase may correspond to the low resistance state, and the amorphous phase may correspond to the high resistance state.

According to the conventional techniques, since a MOS transistor and a storage element should be formed in a memory cell, a fabrication process becomes relatively intricate. Also, since a footprint of the memory cell is big, there is a fundamental limit to increasing the integration density of memory devices.

SUMMARY

Embodiments of the inventive concept provide a memory cell capable of storing data smaller area to obtain a higher integration density than in the conventional art. The memory cell includes a part of a transistor serving as a basic structure, a storage layer of an insulating layer or a variable resistor.

Other embodiments of the inventive concept provide methods of operating and fabricating the memory cell.

Furthermore, other embodiments of the inventive concept provide a memory array including the memory cell, a semiconductor memory device including the memory array, and a method of operating the memory array. Also, it may be easily understood that aspects and advantages of the inventive concept may be realized by units described in the claims and combinations thereof.

The technical objectives of the inventive disclosure are not limited to the above disclosure; other objectives may become apparent to those of ordinary skill in the art based on the following descriptions.

In accordance with an aspect of the inventive concept, a nonvolatile memory device includes a semiconductor substrate, a first and a second diffusion regions formed under a surface of the semiconductor substrate, a storage layer formed on the semiconductor substrate, a gate stacked on the storage layer, wherein the first diffusion region may at least one of active regions being separated by a part of the semiconductor substrate forming a channel region, wherein the second diffusion region may include an active region intersecting the gate insulating layer, wherein the storage layer may include an insulating layer or a variable resistor, and may service as a data storage layer to store data, and may be selected by a structure including the first and the second diffusion regions.

The first diffusion region may include an active region intersecting a gate sidewall spacer.

The memory cell may be configured with other memory cell by sharing at least the first diffusion region.

The memory cell may be configured with other memory cell by sharing at least the gate.

An insulating isolation layer may be formed between at least the second diffusion regions in the semiconductor substrate.

The first and the second diffusion regions may form a diode.

A third diffusion layer or buried oxide layer may be formed below the first diffusion region or the second diffusion region.

A fourth diffusion layer may be formed below the third diffusion layer.

The third diffusion region and the fourth diffusion region or the semiconductor substrate may form a bipolar transistor.

A voltage or current, applied to the fourth diffusion layer or the semiconductor substrate, is controlled for changing a current flow between the second diffusion region and the fourth diffusion region or the semiconductor substrate.

The variable resistor may include a material with characteristics to be low resistance state or high resistance state according to a voltage or a current applied thereto, for example, the variable resistor includes a phase change material, a resistance variable material, or a resistance variable material by magnetic orientation, or may include a data storage element of Phase Change Random Access Memory (PCRAM), Resistive Random Access Memory (ReRAM), or Magnetic Random Access Memory(MRAM), or MTJ(Magnetic Tunnel Junction).

A gate of one memory cell may in one direction and be shared with and be directly connected to a gate of another memory cell arranged in the one direction without passing through a contact.

A contact hole may be formed in the storage layer.

The fourth diffusion layer may be separately formed according to data or bit lines.

A contact hole may be formed on the first diffusion region and the gate, and the contact hole is filled with a conductive material, and a storage layer is additionally formed on the conductive material.

A contact hole may be formed on the storage layer, and the contact hole may be filled with a conductive material, and a storage layer may be additionally formed on the conductive material, or further storage layers repeatedly may be stacked by the same structure.

A top conductive layer may be formed on the storage layer and a bottom conductive layer may be formed under the storage layer.

The conductive material filled in the contact hole and the top and the bottom conductive layers can be merged into a conductive layer.

A voltage or a current, applied to the fourth diffusion region, is varied according to data.

A set or reset is operated by applying to the diode with a reverse bias to make a diode breakdown.

Data may be stored according to with or without formation of the contact hole in the storage layer. Thus, Read Only Memory (ROM) may be formed by a mask determining the formation of the contact hole in the storage layer.

A first diffusion electrode connected to the first diffusion region may be connected to a bit line, or the first diffusion electrode may be connected to the word line.

A method of fabricating a nonvolatile memory device includes or forming a first, second diffusion layer in a semiconductor substrate, forming a storage layer on the semiconductor substrate.

The method of fabrication may include further forming a contact hole in the storage layer and filling the contact hole with a conductive material.

In accordance with an aspect of the inventive concept, the method of fabrication may include further forming a third diffusion region in the semiconductor substrate or forming a third and a fourth diffusion region in the semiconductor substrate.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 1A is a cross-sectional view of a memory cell according to an embodiment of the inventive concept;

FIG. 1B is a cross-sectional view of a memory cell according to another embodiment of the inventive concept;

FIG. 1C is a cross-sectional view of a memory cell according to another embodiment of the inventive concept;

FIG. 1D is a cross-sectional view of a memory cell according to another embodiment of the inventive concept;

FIG. 1E is a cross-sectional view of a memory cell according to another embodiment of the inventive concept;

FIG. 1F is a cross-sectional view of a memory cell according to another embodiment of the inventive concept;

FIG. 2A is a cross-sectional view of two memory cells according to another embodiment of the inventive concept;

FIG. 2B is a cross-sectional view of two memory cells according to another embodiment of the inventive concept;

FIG. 2C is a cross-sectional view of a memory cell according to another embodiment of the inventive concept;

FIG. 3 is a cross-sectional view of four memory cells according to another embodiment of the inventive concept;

FIG. 4A is a cross-sectional view illustrating preparation of a semiconductor substrate with a fourth diffusion region to fabricate a memory according to an embodiment of the inventive concept;

FIG. 4B is a cross-sectional view illustrating formation of an insulating isolation layer to fabricate a memory according to an embodiment of the inventive concept;

FIG. 4C is a cross-sectional view illustrating formation of a third diffusion region to fabricate a memory according to an embodiment of the inventive concept;

FIG. 4D is a cross-sectional view illustrating formation of a second diffusion region to fabricate a memory according to an embodiment of the inventive concept;

FIG. 4E is a cross-sectional view illustrating formation of a storage, a gate, and sidewall spacers to fabricate a memory according to an embodiment of the inventive concept;

FIG. 4F is a cross-sectional view illustrating formation of a first diffusion region to fabricate a memory according to an embodiment of the inventive concept;

FIG. 4G is a cross-sectional view illustrating formation of a contact hole to fabricate a memory cell according to an embodiment of the inventive concept;

FIG. 4H is a cross-sectional view illustrating filling the contact hole with a conductive material to fabricate a memory cell according to an embodiment of the inventive concept;

FIG. 5 is a circuit diagram of a memory cell according to an embodiment of the inventive concept;

FIG. 6A is a circuit diagram of a memory cell according to another embodiment of the inventive concept;

FIG. 6B is a circuit diagram of a memory cell according to another embodiment of the inventive concept;

FIG. 7 is a circuit diagram of a memory cell according to another embodiment of the inventive concept;

FIG. 8A is a layout of a memory array—A according to an embodiment of the inventive concept;

FIG. 8B is a layout of a memory array—A according to another embodiment of the inventive concept;

FIG. 8C is a layout of a memory array—A according to another embodiment of the inventive concept; and FIG. 9 is a construction diagram of the entire memory device according to an embodiment of the inventive concept.

DETAILED DESCRIPTION OF THE EMBODIMENTS

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The following detailed description is merely exemplary in nature and is not intended to limit the application and uses contemplated herein. Furthermore, there is no intention to be bound by any theory presented in the preceding background or the following detailed description.

The inventive concept will now be described more fully hereinafter with reference to the accompanying drawings, in which embodiments of the inventive concept are shown.

A structure according to the inventive concept may be formed on a semiconductor substrate including a bulk silicon wafer or a silicon thin layer disposed on an insulating layer (typically referred to as a silicon-on-insulator (SOI)).

Hereinafter, a state in which a resistive path is not present in a storage layer of a memory cell will be defined as data '0,' and a state in which the resistive path is formed in the storage of the memory cell will be defined as data '1.' The inventive concept is not limited thereto. For example, the state in which the resistance path is not present will be defined as data '1,' and the state in which the resistance path is formed will be defined as data '0.'

FIG. 1A is a cross-sectional view of a memory cell 250 according to an embodiment of the inventive concept.

FIG. 5 is a circuit diagram of the memory cell 250 shown in FIG. 1A, according to an embodiment of the inventive concept.

As shown in FIG. 1A, the memory cell 250 according to the embodiment of the inventive concept may include a part of a transistor.

The memory cell 250 shown in FIG. 1A may include a MOS transistor similar to a typical MOS transistor as a basic component. Specifically, the memory cell 250 may include a fourth diffusion region 215, a storage layer 235 on a semiconductor substrate, a gate 240 stacked on the storage layer 235, a gate electrode GG connected to the gate 240, sidewall spacers 225 formed on sidewalls of the gate 240, a first diffusion region 226, and a first diffusion electrode DD connected to the first diffusion region 226.

Although the present embodiment pertains to an example in which sidewall spacers are formed, the inventive concept is not limited thereto and may be applied to a modified example in which sidewall spacers are not formed.

As shown in FIG. 1A, the first diffusion region 226 is at least one of active regions being separated by a part of the semiconductor substrate forming a channel region. The second diffusion region 216 may refer to a region of an active region, which may intersect the storage layer 235 or the sidewall spacers 225. The second diffusion region 216 may be doped with a complementary dopant to the first diffusion region. Thus the first and the second diffusion regions 226, 216 may form a diode.

As shown in FIG. 1A, a third diffusion region 266 or a buried oxide 226 may be formed below the first and the second diffusion layer 226, 216. The third diffusion region 266 may be doped with a similar dopant to the first diffusion region 266.

Although in the case that the buried oxide is formed, the memory cell may be formed on a semiconductor substrate including a SOI instead of a semiconductor substrate including a bulk silicon wafer, the inventive concept is not limited to the semiconductor substrate including the SOI.

A fourth diffusion region 215 may be formed the semiconductor substrate 215 may be below the third diffusion region 266 or the buried oxide 266. The fourth diffusion region 215 or the semiconductor substrate 215 may be doped with a complementary dopant to the third diffusion region 266. Thus the second diffusing region, 216 the third diffusion region 266 and the fourth diffusion region 215 or the semiconductor substrate 215 may form a bipolar transistor.

The diode or the bipolar transistor may be an element to select the storage layer.

The gate 240 may be the metal layer, and the storage layer 235 may include an insulating layer or a variable resistor and serve as a data storage.

As shown in FIG. 1A, the storage layer 235 between the gate 240 and the second diffusion region 217 may serve as a storage configured to store data and be separately illustrated with a dotted ellipse 276 for clarity.

As shown in FIG. 1A, the gate 240 may include a conductive layer formed of a metal, a silicide, a metal compound, or poly crystalline silicon (poly-Si). Like a typical transistor, the gate 240 may include a conductive layer formed of poly-Si.

In FIG. 1A, the fourth diffusion region 215 may be typically doped with a P-type or N-type dopant.

In an embodiment of the inventive concept, it is assumed that the fourth diffusion region 215 is an N type. Accordingly, the first and the third diffusion region 226, 266 may become an P-type semiconductor that is doped with a complementary dopant to the fourth diffusion region 215 or the semiconductor substrate 215, and the second diffusion region 216 may become an N-type semiconductor that is doped with a dopant similar to the fourth diffusion 215 or the semiconductor substrate 215.

The first and the second diffusion regions 226, 216 may be formed of, for example, a P-type semiconductor and an N-type semiconductor, respectively, and constitute a PN junction diode structure. Conversely, the first and the second diffusion regions 226,216 may be formed of an N-type dopant and a P-type dopant, respectively, and constitute a PN junction diode structure.

As is widely known to one skilled in the art, when a lightly doped semiconductor is in contact with a metal, a Schottky diode may be formed.

Furthermore, in another embodiment of the inventive concept, the first and the second diffusion region 226, 217 may be formed of a semiconductor lightly doped with a similar dopant each other, the first diffusion electrode DD connected to the first diffusion region may be formed of silicide or a metal, and Schottky diode structures may be formed.

Referring to FIG. 1A, according to an embodiment of the inventive concept, the first and the second diffusion region 226, 216 may be formed of a semiconductor and a metal, respectively, and form a Schottky diode. That is, the second diffusion region 216 may be formed of a semiconductor lightly doped with a dopant, and the first diffusion region 226 may be formed of silicide. Conversely, the first and the second diffusion regions 226 and 216 may be formed of a metal and a semiconductor, respectively, and form a Schottky diode.

The formation of the diode structure according to the present invention is not limited to the above description.

In another embodiment of the inventive concept, a contact hole may be formed in the storage layer and may be filled with a conductive material.

As compared with FIG. 1A, FIG. 1B shows a case in which a contact hole is formed in the storage layer 235 and is filled with a conductive material. If the conductive material is used the same as the gate, it can be a buried contact for simplified fabrication.

The storage layer has a similar effect with a low resistance state by the conductive material. Thus, the storage layer 235 stores data '1'. A storage stores data '0' if the storage layer has a high resistance state because there is no the contact hole in the storage layer. It may be converted to mask Read Only Memory (ROM) by comprising the memory cell without the contact hole shown in FIG. 1A and the memory cell with the contact hole 299 shown in FIG. 1B.

In another embodiment of the inventive concept, a contact hole may be formed on the first diffusion region and the gate, and the contact hole may be filled with a conductive material, and a storage layer may be additionally formed on the conductive material.

As compared with FIG. 1B, FIG. 1C shows a case in which a storage layer 237 with a top and bottom electrodes 242, 212 is additionally formed. The storage layer 237 places between the top and bottom electrodes 242, 212. The top electrode 242 is connected to MM0 and the bottom electrode 212 is connected to a contact hole 199 connected to a first diffusion region 226. The contact hole 199 is many level of contact holes stacked to connect with many level of conductive layers.

As compared with FIG. 1B, FIG. 1D shows a case in which a storage layer 237 with a top and bottom electrodes 242, 212 is additionally formed. The storage layer 237 places between the top and bottom electrodes 242, 212. The top electrode 242 is connected to MM0 and the bottom electrode 212 is connected to a contact hole 399 connected to a gate 240. The contact hole 399 is many level of contact holes stacked to connect with many level of conductive layers.

In another embodiment of the inventive concept, a contact hole may be formed on the storage layer, and the contact hole may be filled with a conductive material, and a storage layer may be additionally formed on the conductive material, or further storage layers repeatedly may be stacked by the same structure.

As compared with FIG. 1D, FIG. 1E show a case in which a storage layer 239 with a top and bottom electrodes 244, 214 is additionally formed. The storage layer 239 places between the top and bottom electrodes 244, 214. The top electrode 242 is connected to MM1 and the bottom electrode 214 is connected to a contact hole 499 connected to a top electrode 242 on a storage layer 237 240. The contact hole 499 is many level of contact holes stacked to connect with many level of conductive layers. The further storage layer with the top and bottom electrodes may be repeatedly formed as the above description. A repeated description thereof is omitted for brevity.

In accordance with an aspect of the inventive concept, a contact hole may be formed on the storage layer, and the contact hole may be filled with a conductive material, and a storage layer may be additionally formed on the conductive material, or further storage layers repeatedly may be stacked by the same structure.

As compared with FIG. 1B, FIG. 1F shows a case in which a storage layer 835 is additionally formed on a storage layer 235 and a contact hole 299.

There are several configurations to form an array with memory cells.

In an embodiment of the inventive concept, the memory cell and adjacent memory cell may share at least its first diffusion region. These embodiments are shown in FIG. 2A. As shown in FIG. 2A, a first, third, and fourth diffusion regions 228, 268, 215 are shared. As shown in FG 2A, a first diffusion electrode DD is connected to the shared first diffusion region, there are gate electrodes GG0, GG1 and storage layers 235. As shown in FIG. 2A, the storage layers 235 as storages configured to store data are separately illustrated with a dotted ellipse 276, 277 for clarity.

Furthermore, in another embodiment of the inventive concept, the memory cell and adjacent memory cell may share at least its gate and storage layer. These embodiments are shown in FIG. 2B. As shown in FIG. 2B, a gate 240 and a storage layer 235 are shared.

As shown in FIG. 2B, a gate electrode GG is connected to the shared gate, there are first diffusion electrodes DD0, DD1 and storage layer 235. There is an insulating isolation layer 210 between second diffusion regions 216, 217 and between third diffusion regions 266, 267. Referring to FIG. 2B, unlike a typical transistor, the first electrodes DD0, DD1 may be disconnected each other due to an electrical isolation function of the insulating isolation layer 210 shown in FIG. 2B. As shown in FIG. 2B, the storage layers 235 as storages configured to store data are separately illustrated with a dotted ellipse 276, 277 for clarity.

As compared with FIG. 2A, FIG. 2C shows one memory cell with an insulating isolation layer 212.

As compared with FIG. 2A, FIG. 3 shows two FIG. 2A with different fourth diffusion regions.

Since the above-described modified embodiments may be easily understood by one skilled in the art, a detailed description thereof will be omitted here. However, the present inventive concept should be interpreted as including various modified embodiments.

A method of fabricating a nonvolatile memory device according to the inventive concept may include forming a first, second diffusion layer in a semiconductor substrate, forming a storage layer on the semiconductor substrate.

The method of fabricating the memory device according to the inventive concept may include further forming a contact hole in the storage layer and filling the contact hole with a conductive material.

The method of fabricating the memory device according to the inventive concept may Include further forming a third diffusion region in the semiconductor substrate or forming a third and a fourth diffusion region in the semiconductor substrate.

Various process operations for fabricating typical MOS transistors are widely known. Accordingly, conventional process operations will be briefly described for clarity, or some known processes will be wholly omitted.

A method of fabricating a memory device according to an embodiment of the inventive concept is illustrated in FIGS. 4A through 4E.

The method of fabricating the memory cell according to the embodiment of the inventive concept may start from an operation of preparing a semiconductor substrate with a fourth diffusion region 215 as shown in FIG. 4A.

The semiconductor substrate may be a single crystalline silicon substrate. Although the present embodiment pertains to an example in which a bulk silicon wafer is used, the inventive concept is not limited thereto.

The fourth diffusion region 215 may be a P-type well doped with a P-type dopant or an N-type well doped with an N-type dopant. In the present embodiment, it is assumed that the fourth diffusion region 215 is the N-type well doped with the N-type dopant.

Thereafter, referring to FIG. 4B, an insulating isolation layer 210 may be formed. The insulating isolation layer 210 may be formed using a typical shallow trench isolation (STI) technique. In this case, the insulating isolation layer 210 may be formed without forming an additional mask.

The formation of the insulating isolation layer 210 may include forming trenches by etching the surface of the semiconductor substrate 215 and filling the trenches with an insulating material. After filling the trenches with the insulating material, the resultant structure may be planarized using, for example, a chemical mechanical polishing (CMP) process.

Thereafter, as shown in FIG. 4C, a third diffusion region 269 and may be formed. As described above, the third diffusion region 269 may be doped using a dopant that is complementary to the fourth diffusion region 215. Therefore, the third diffusion 269 may be a P-type semiconductor. Accordingly, a P-type dopant may be implanted into the third diffusion region 269 in the arrow direction shown in FIG. 4C.

The third diffusion region 269 may be implanted with ions to have about 1 to 1.5 times the depth of a first diffusion region to be subsequently formed. For example, when the first diffusion regions have a depth of about 0.2 μm, the third diffusion region 266 and 267 may have a depth of about 0.2 μm to about 0.3 μm.

Thereafter, as shown in FIG. 4D, a second diffusion regions 216, 217 may be formed. As described above, the second diffusion regions 216, 217 may be doped with a dopant that is complementary to the third diffusion region 269. Therefore, the second diffusion regions 216, 217 may be N-type semiconductor. Accordingly, an N-type dopant may be implanted into the second diffusion regions 216 and 217 in the arrow direction shown in FIG. 4D.

The second diffusion regions 216, 217 may be implanted with ions to have about 50%~100% of the depth of the first diffusion regions to be subsequently formed. For example, when the first diffusion regions have a depth of about 0.2 μm, the second diffusion regions 216, 217 may have a depth of about 0.1~0.2 μm. As described above, according to embodiments of the inventive concept, the second diffusion regions 216, 217 may be implanted with ions in a self-aligned manner by the insulating isolation layer 210. This is because the insulating isolation layer 210 serves as an ion implantation mask.

The second diffusion regions 216, 217 may be ion-implanted in a self-aligned manner by the insulating isolation layer 210. This is because the insulating isolation layer 210 may serve as an ion implantation mask.

The second diffusion regions 216, 217 may be formed before forming the gate. However, the inventive concept is not limited thereto. For example, like a typical lightly doped drain (LDD) structure, the second diffusion regions 216, 217 may be formed after forming the gate.

Thereafter, referring to FIG. 4E, the storage layer 235 may be stacked, and a gate including a metal layer 242 and a conductive layer 240 stacked on the metal layer 242 may be formed on the gate insulating layer 235, and sidewall spacers 225 may be formed on sidewalls of the gate. Although the present embodiment pertains to an example in which the sidewall spacers 225 are formed, the inventive concept is not limited thereto and may be applied to a modified example in which sidewall spacers are not formed.

In an embodiment of the inventive concept, the gate insulating layer 235 may be formed using a gate oxide layer, and the conductive layer 240 may be formed of poly-Si.

The gate oxide layer may be formed by growing a thermal oxide layer on the surface of the semiconductor substrate 215 or depositing an oxide layer.

The gate oxide layer may have a thickness of about 1 nm to about 10 nm. The thickness of the gate oxide layer may be as thin as possible to reduce a voltage (VPP) for a program operation.

In another embodiment, the storage layer 235 may be formed using a variable resistor.

The storage layer 235 may be formed by stacking the variable resistor on the surface of the semiconductor substrate to a predetermined thickness instead of an oxide layer. The variable resistor may be a compound layer formed by stacking various materials.

The variable resistor may be a resistance variable material, a phase transition material, or another material having memory characteristics capable of two stable resistance states.

The resistance variable material may be one of various materials, such as perovskite, a transition metal oxide, or a chalcogenide. The resistance variable material may be a material whose electrical resistance is changed into a low resistance state or a high resistance state due to a predetermined voltage. The resistance variable material may be any one of a binary transition metal oxide and a tertiary transition metal oxide or a combination thereof. The binary transition metal oxide may be $TiO_2$, NiO, $HfO_2$, $Al_2O_3$, $ZrO_2$, ZnO, $Ta_2O_5$, or $Nb_2O_5$, and the tertiary transition metal oxide may be $SrTiO_3$, HfAlO, HfSiO, or HfTiO.

Furthermore, the resistance variable material may be any one of copper (Cu)-doped $SiO_2$, silver (Ag)-doped $SiO_2$, a Cu-doped germanium-selenium-tellurium (Ge—Se—Te) compound, an Ag-doped Ge—Se—Te compound, and a $CuO_x$-based resistance variable material or a combination thereof.

The phase transition material may be a material that is changed into a crystalline phase or an amorphous phase due to a predetermined current. A chalcogenide-based compound may be used as the phase transition material. The chalcogenide-based material having phase transition characteristics may be a binary compound, a tertiary compound, or a quaternary compound, which includes a combination of at least two of Ge, Te, antimony (Sb), indium (In), Se, and tin (Sn), or the binary, tertiary, or quaternary compound to which bismuth (Bi) is added. The phase transition material may be $Ge_2Sb_2Te_5$, or $Ge_2Sb_2Te_5$ into which any one of nitrogen (N), oxygen (O), $SiO_2$, and $Bi_2O_3$ is doped, or a combination thereof.

As shown in FIG. 4E, a gate 240 may be deposited using poly-Si on the storage layer 235, and the conductive layer 240 formed of poly-Si may be patterned using etching and photolithography processes.

After the patterning process, heat may be applied in an oxidation atmosphere so that a silicon oxide thin layer (not shown) can be thermally grown on sidewalls of the gate 240 and 242 to form sidewall spacers 225.

Thereafter, as shown in FIG. 4F, a dopant may be implanted in the arrow direction to form a first diffusion region 226, 227.

Since the first diffusion regions 226, 227 should be doped with a dopant that is complementary to the second diffusion regions 216, 217, a P-type dopant may be ion-implanted into the first diffusion regions 226, 227 in the present embodiment.

According to an embodiment of inventive concept, the method of fabricating a nonvolatile memory device includes further forming a contact hole in the storage layer and filling the contact hole with a conductive material.

The embodiment is shown in FIGS. 4G, 4H. As shown in FIG. 4G, after the gate oxide layer is formed, a contact hole 699 may be formed. The contact hole 699 is desirable to be formed by oxide etching process. Filling the contact hole 699 with a conductive material is subsequent after forming the contact hole. As shown in FIG. 4H, a gate 240 may be formed by filling the contact hole 699 with a conductive material and simultaneously depositing the conductive material on the gate oxide.

As shown in FIG. 4H, a left first diffusion region 216 is connected to the gate via the formation of the contact hole. Thus, data '0' is stored. Aright second diffusion 217 region is not connected to the gate because of no formation of the contact hole. Thus, data '1' is stored. Accordingly it may be converted to Read Only Memory (ROM) by the fabrication with a mask determining the formation of the contact hoe in the storage layer.

Finally, the fabrication of the memory according to the inventive concept may be completed by known process operations (not shown) of, for example, depositing a dielectric material layer, etching openings through the dielectric material layer to expose portions of the first diffusion region, and forming metalized portions to extend through the openings and be electrically connected to the first diffusion region.

FIG. 5 is an equivalent circuit diagram of the memory cells shown in FIG. 1A, according to an embodiment of the inventive concept, and FIG. 6A is an equivalent circuit diagram of the memory cell shown in FIG. 2A, and FIG. 6B is an equivalent circuit diagram of the memory cell shown in FIG. 2B. An equivalent circuit of the memory cell shown in FIG. 6B is omitted because it would be easily understood with reference to FIGS. 2A and 6A.

In accordance with an aspect of the inventive concept, the second, third diffusion regions and the fourth diffusion region or the semiconductor substrate may form a bipolar transistor As shown in 5, a storage layer 235 shown in FIG. 1A may be simply represented as a variable resistor 276 because it is an insulating layer or a variable resistor layer. In FIG. 1A, an embodiment of the inventive concept is a case with a third diffusion region, instead of buried oxide layer. A diode structure between a first, third diffusion regions 226, 266 and a second diffusion 216 in FIG. 1A may be represented as a first diode 286 in FIG. 5. A diode structure between a first, third diffusion regions 226, 266 and a fourth diffusion 215 in FIG. 1A may be represented as a second diode 296 in FIG. 5. The first and the second diodes 286, 296 may be a bipolar transistor.

Typically, when the storage layer 235 is an oxide layer, a VCC voltage may be adjusted such that an electric field of about 5 MV/cm is applied to the oxide layer 235. Also, to cause a gate breakdown in the oxide layer 235 and generate a resistive path, a VCC voltage may be adjusted such that an electric field of about 20 MV/cm is applied to the oxide 235.

For example, assuming that the gate insulting layer has a thickness of about 2.3 nm in a process using a gate length of about 130 nm, a VCC voltage may be about 1.2 V, and a VPP voltage required for generating a resistive path may be about 5 V.

Accordingly, in the above-described example, a VPP voltage for a program operation may be about 6V considering a diode threshold.

Hereinafter, a case in which the storage layer 235 is an insulating layer will be referred to as an A type, and a case in which the gate insulating layer 235 is a variable resistor will be referred to as a B type.

A nonvolatile memory including an A-type memory cell and a method of operating the same may be similar to a nonvolatile memory including a B-type memory cell and a method of operating the same except that, in the A-type memory cell, a gate insulating layer serving as a storage layer is difficult to be changed from a low resistance state (LRS) into a high resistance state (HRS), unlike a variable resistor. Thus, since the above-described circuit and operation of the memory device including the A-type memory cell according to an embodiment of the inventive concept may be easily applied to a circuit and operation of a memory device including a B-type memory cell, a repeated description will be omitted for brevity.

For example, the above-described VPP voltage, which is a program voltage, may be a voltage required to generate a resistive path in a gate insulating layer and send the gate insulating layer from a high resistance state (HRS) into a low resistance state (LRS).

Similarly, a set voltage may change a variable resistor from a high resistance state (HRS) into a low resistance state(LRS).

Accordingly, the VPP voltage serving as the program voltage may be adjusted to be the set voltage (VSET) for the variable resistor, and a program operation may be performed in a similar manner to the case in which the memory device includes the A-type memory cell.

Furthermore, the VPP voltage, which is the program voltage, may be adjusted to be a reset voltage(VRESET) and send the variable resistor from a low resistance state(LRS) into a high resistance state(HRS).

But, in bipolar switch case, a voltage polarity across the variable resistor for set should is reverse with a voltage polarity for reset.

According to the inventive concept. A voltage or current, applied to the fourth diffusion layer or the semiconductor substrate, may be controlled for changing current flow between the second diffusion region and the fourth diffusion region or the semiconductor substrate.

A set and reset operation of a memory according to an embodiment of the inventive concept will described in the case that a storages layer operate with bipolar switching.

In the case of using a diode for bipolar switching bias across the storage layer according to another embodiment of the inventive concept, a set or reset may be operated by applying to the diode with a reverse bias to make a diode breakdown.

According to the inventive concept, a voltage or current may be differently applied to the fourth diffusion region according to data.

FIG. 7 is an equivalent circuit diagram of the memory cells shown in FIG. 3.

As shown in FIG.7, four memory cells are illustrated. Set and reset simultaneously may operate in memory cells. When 0V and VRESET voltage are applied to gates GG0, GG2, respectively, and VSEL voltage is applied to a first diffusion electrodes DD0, DD1, and VSET voltage, 0V are applied to a fourth diffusion electrodes SB0, SB1, respectively, a NPN bipolar transistor including a first and a second diodes 286, 296 is in operating condition. Thus, the current of the bipolar transistor flows toward GG0, and VSET voltage with dropped diode threshold voltage across a first storage layer is applied. Therefore, the first storage layer 276 is in a Low Resistance state (LRS).

Another NPN bipolar transistor including the first and the second diodes 387, 397 is in operating condition. Thus, the current of the bipolar transistor flows toward SB1, and VRESET voltage with dropped diode threshold voltage across a second storage layer 297 is applied with opposite current flow of set. Therefore, the third storage layer 376 is in High Resistance State (HRS).

In FIG. 7, read may operate. When 0V voltage is applied to gates GG0, GG2, and VCC voltage is applied to first diffusion electrodes DD0, DD1, and fourth diffusion electrodes SB0, SB1, a NPN bipolar transistor including a first and a second diodes 286, 296 is in operating condition and the first storage layer 276 is in Low Resistance State (LRS). Thus, the current flows toward GG0. But the third storage layer 376 is in High Resistance State (HRS). Thus, the current doesn't flow toward GG2.

Accordingly, the resistance state of the storage layer can be converted to digital signal through a read circuitry to sense the current.

As described above, there are two methods for connecting word lines and bit lines in the memory cell 250. In a first method, a gate electrode GG may serve as a word line, each of a first diffusion electrode DD may serve as a bit line.

In a second method, as opposed to the first method, a gate electrode GG may serve as a bit line, a first diffusion electrode DD may serve as a word line.

FIG. 8A illustrates the layout of a memory array according to an embodiment of the inventive concept.

In FIG. 8A, the layout of the two memory cells 550 is separately illustrated with a dotted square.

A cross-sectional view of the two memory cells 550, which is taken along line A-A' of FIG. 8A, is the same as in FIG. 2A except for a contact 366 to be connected to a word line WL2 and the word line WL2.

As shown in FIG. 8A, the two memory cells 550 may be arranged in a matrix shape. In this case, the two memory cells 550 may not be continuously arranged but may be alternately arranged in every other row and in every other column. That is, the two memory cells 550 may be disposed in a pattern similar to a check board.

When the two memory cells 550 are instead continuously arranged, a bit line may be shared between two memory cells, so that data of the two memory cells may collide in the shared bit line. To prevent this problem, the two memory cells 550 may be arranged as shown in FIG. 8A.

Referring to FIG. 8A, word lines WL0, WL1, WL2, . . . may run in an X direction, and bit lines BL0, BL1, BL2, . . . may run in a Y direction. Active regions 412, 420, 424, and 432 may include regions in which spaces between the bit lines BL0, BL1, BL2, . . . intersect the word lines WL0, WL1, WL2, . . . .

The active regions are connected the world lines and the remaining region of the active regions is corresponding to a shallow trench isolation (STI) region.

As shown in FIG. 8A, regions 362 and 364 in which an active region 420 intersects bit lines BL0, BL1 may be a second diffusion region and are separately striped for clarity.

The inventive concept is characterized in that a gate of one memory cell may run in one direction and be shared with and be directly connected to a gate of another memory cell arranged in the one direction without passing through a contact.

For example, referring to FIG. 8A, a gate BL2 of a memory cell having a seconding diffusion region 324 may run in a lengthwise direction and be shared with and be directly connected to a gate BL2 of a memory cell having a second diffusion region 344 adjacent thereto in the lengthwise direction.

Since the gate of adjacent memory cells may be directly connected without passing through a contact, a horizontal area of a memory array may be reduced.

FIG. 8B illustrates the layout of a memory array according to another embodiment of the inventive concept.

In FIG. 8B, the layout of the two memory cells 550 is separately illustrated with a dotted square.

A cross-sectional view of the two memory cells 550, which is taken along line A-A' of FIG. 8B, is the same as in FIG. 2A except for a contact 366 to be connected to a word line WL2 and the word line WL2.

As shown in FIG. 8B, the two memory cells 550 may be arranged in a matrix shape. In this case, the two memory cells 550 may be arranged in every row and in every other column. The two memory cells 550 are arranged as shown in FIG. 8B for the same reason as described above.

Since the layout of the memory array of FIG. 8B is similar to that of the memory array of FIG. 8A, a repeated description thereof is omitted for brevity.

FIG. 8C illustrates the layout of a memory array according to another embodiment of the inventive concept.

In FIG. 8C, the layout of a memory cell 558 is separately illustrated with a dotted square.

A cross-sectional view of the memory cell 558, which is taken along line B-B' of FIG. 8C, is the same as in FIG. 2C except for a contact 366 to be connected to a word line WL2 and the word line WL2.

As shown in FIG. 8C, the memory cells 558 may be arranged in a matrix shape. In this case, one bit line may intersect a gate in each of the memory cells 558 so that each of the memory cells 558 may have one storage region.

FIG. 9 shows the overall configuration of a memory device according to an embodiment of the inventive concept.

The overall memory device according to the inventive concept may include a memory array in which a plurality of memory cells are arranged, an internal supply unit configured to generate a voltage VSET, VRESET and VSB used for the memory array, a row decoder configured to select a word line from the memory array, a column decoder configured to select a bit line, a write circuit configured to receive a data bus from an input/output (I/O) unit and transmit the data bus to a global bit line bus GBL under the control of a controller, a read circuit required for a read operation including transmitting stored data to the global bit line bus GBL, sensing and amplifying an electrical state of the global bit line bus using a sense amplifier, converting the sensed and amplified electrical state into a digital signal, and transmitting the digital signal to the I/O unit, a controller configured to control the inside of the memory device, and the I/O unit configured to allow the outside of the memory device to interface with the inside of the memory device.

The configuration of the memory device will now be briefly described. The memory device may include the above-described memory array 140 and an internal supply unit 110 configured to generate the voltage VSET, VRESET, and VSB required for set and reset operation.

Furthermore, the memory device may include the row decoder 150 configured to select a word line form the memory array 140 and the column decoder 160 configured to select a bit line.

Referring to FIG. 9, the row decoder 150 and the column decoder 160 may receive an address bus from the I/O unit 130, be controlled by a controller 120, and decode an address.

The memory device may include the write circuit 170 used for a data write operation. The write circuit 170 may receive the data from the I/O unit 130 and transmit the data to the global bit line bus GBL (GBL0, GBL1, GBL2, . . . ) under the control of the controller 120.

Referring to FIG. 9, the memory device may include a read circuit 180 required for a data read operation. Stored data may be transmitted to the global bit line bus GBL (GBL0, GBL1, GBL2, . . . ), and a sense amplifier 181 in the read circuit 180 may sense and amplify an electrical state of the global bit line bus GBL, convert the sensed and amplified electrical state into a digital signal, and transmit the digital signal to the I/O unit 130.

The I/O unit 130 may allow the outside of the memory device to interface with the inside thereof. The controller 120 may receive commands required for the write and read operations from the I/O device 130, analyze the commands in detail, and control circuits related with the commands.

Construction of the memory device according to the embodiment of the inventive concept may be modified. For example, the memory device is not limited to a one-time programmable (OTP) device and a multi-time programmable (MTP) device and may be used for a storage device storing information on a redundancy repair including a fuse, which may be used in various semiconductor devices, such as a dynamic random access memory (DRAM) or a static random access memory (SRAM). Also it may be used for a storage device storing information required for programmable logic device (PLD) and field programmable gate array(FPGA).

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device comprising: a plurality of memory cells, wherein a memory cell of the plurality of the memory cells, comprising:
 a semiconductor substrate;
 a first storage layer formed on the semiconductor substrate;

a first diffusion region formed in the semiconductor substrate on one side of the first storage layer;

a second diffusion region formed in the semiconductor substrate under the first storage layer;

a first contact hole is formed in the first storage layer;

a diode formed between the first diffusion region and the second diffusion region, configured to select the first storage layer, and connected to the first contact hole; and a gate stacked on the first storage layer, wherein the first storage layer includes an insulating layer or a variable resistor, wherein the first contact hole connects the second diffusion region and the gate and is filled with a conductive material, and wherein the first diffusion region is formed apart from the first storage layer.

2. The device of claim 1, wherein further comprising:
a sidewall spacer formed laterally along a sidewall of the gate, wherein the sidewall spacer is formed on a portion of the second diffusion region.

3. The device of claim 1, wherein the plurality of the memory cells are configured to share the first diffusion region of the memory cell.

4. The device of claim 1, wherein the plurality of memory cells are configured to share the gate of the memory cell.

5. The device of claim 4, wherein the device further comprising:
an insulating isolation layer is formed between the second diffusion regions of the plurality of memory cells.

6. The device of claim 1, wherein the device further comprising:
a third diffusion layer or a buried oxide layer is formed below the second diffusion region.

7. The device of claim 6, wherein the device further comprising:
a fourth diffusion layer is formed below the third diffusion layer.

8. The device of claim 7, wherein the second, third diffusion regions and the fourth diffusion region form a bipolar transistor.

9. The device of claim 8, wherein a voltage or current applied to the fourth diffusion layer is controlled for changing a current flow between the second diffusion region and the fourth diffusion region.

10. The device of claim 3, wherein the plurality of the memory cells are configured to share the fourth diffusion layer if the plurality of the memory cells shares the same data or bit lines.

11. The device of claim 7, wherein a voltage or a current, applied to the fourth diffusion region, is varied according to data.

12. The device of claim 1, wherein the variable resistor includes a material with characteristics to be in low resistance state or high resistance state by a voltage or a current, for example, the variable resistor includes a phase change material, a resistance variable material, or a resistance variable material by magnetic orientation, or includes a data storage element of Phase Change Random Access Memory (PCRAM), Resistive Random Access Memory (ReRAM), or Magnetic Random Access Memory (MRAM), or MTJ (Magnetic Tunnel Junction).

13. The device of claim 1, wherein the gate of one memory cell runs in one direction and is shared with and is directly connected to a gate of another memory cell arranged in the one direction without passing through a contact.

14. The device of claim 1, wherein the device further comprising:
a second contact hole is formed on the first diffusion region and/or the gate, and the second contact hole is filled with a conductive material, and a second storage layer is additionally formed on the conductive material, and the second storage layer includes the insulating layer or the variable resistor.

15. The device of claim 14, wherein the device further comprising:
a third contact hole is formed on the second storage layer, and the third contact hole is filled with a conductive material, and a third storage layer is additionally formed on the conductive material and includes the insulating layer or the variable resistor, or further storage layers repeatedly are stacked by the same structure.

16. The device of claim 14, wherein the device further comprising:
a top conductive layer is formed on the second storage layer and a bottom conductive layer is formed under the second storage layer.

17. The device of claim 14, wherein the conductive material filled in the second contact hole and the top and the bottom conductive layers are merged into a conductive layer.

18. The device of claim 1, wherein a set or a reset are operated by applying to the diode with a reverse bias to make a diode breakdown.

19. The device of claim 1, wherein data is stored according to with formation of the contact hole in the first storage layer.

20. The device of claim 1, wherein the device further comprising:
a first diffusion electrode connected to the first diffusion region is connected to a bit line, or the first diffusion electrode is connected to the word line.

21. The device of claim 20, wherein data is stored according to whether the first diffusion electrode is connected to the bit line or not.

* * * * *